United States Patent [19]
Arthur et al.

[11] Patent Number: 5,354,611
[45] Date of Patent: * Oct. 11, 1994

[54] DIELECTRIC COMPOSITE

[75] Inventors: David J. Arthur, Norwood; Gwo S. Swei, Northboro, both of Mass.; Phong X. Nguyen, New Britain, Conn.

[73] Assignee: Rogers Corporation, Rogers, Conn.

[*] Notice: The portion of the term of this patent subsequent to Jul. 18, 2006 has been disclaimed.

[21] Appl. No.: 71,345

[22] Filed: May 28, 1993

Related U.S. Application Data

[63] Continuation of Ser. No. 808,206, Dec. 13, 1991, abandoned, which is a continuation of Ser. No. 483,502, Feb. 21, 1990, abandoned.

[51] Int. Cl.$^5$ .................... B32B 18/00; C08K 9/04
[52] U.S. Cl. .................... 428/325; 264/211; 428/331; 428/402; 428/405; 428/406; 428/421; 428/422; 521/54; 523/218; 523/219
[58] Field of Search ........... 428/325, 331, 402, 405, 428/406, 421, 422; 521/54; 523/218, 219; 264/175, 176.1, 211, 331.14

[56] References Cited

U.S. PATENT DOCUMENTS

| | | | |
|---|---|---|---|
| 4,250,136 | 2/1981 | Rox | 428/325 |
| 4,307,142 | 12/1981 | Blitstein et al. | 428/325 |
| 4,478,963 | 10/1984 | McGarry | 523/206 |
| 4,568,529 | 2/1986 | Leconte | 428/325 |
| 4,798,762 | 1/1989 | Okoda et al. | 428/325 |
| 4,849,284 | 7/1989 | Arthur et al. | 428/901 |
| 4,900,629 | 2/1990 | Pitolaj | 428/325 |
| 4,937,132 | 6/1990 | Gako et al. | 428/901 |
| 5,024,871 | 6/1991 | Arthur et al. | 428/331 |
| 5,045,575 | 9/1991 | Gabayson | 523/458 |
| 5,061,548 | 10/1991 | Arthur et al. | 428/325 |

FOREIGN PATENT DOCUMENTS 0176062  2/1986  European Pat. Off. .

Primary Examiner—D. S. Nakarani
Attorney, Agent, or Firm—Fishman, Dionne & Cantor

[57] ABSTRACT

A composite material is disclosed. The material comprises a polymeric matrix and from about 20 volume percent to about 70 volume percent inorganic particles distributed throughout the matrix. Suitable inorganic particles include hollow inorganic microspheres and porous inorganic particles. The inorganic particles are coated with a surface coating. The composite material of the present invention exhibits a dielectric constant of less than about 2.5 and a thermal coefficient of expansion of less than about 70 ppm/°C.

34 Claims, 1 Drawing Sheet

DIELECTRIC COMPOSITE

This is a continuation of copending application(s) Ser. No. 07/808,206 filed on Dec. 13, 1991 now abandoned which is a continuation of Ser. No. 07/483,502 filed on Feb. 21, 1990 now abandoned.

CROSS REFERENCE TO RELATED APPLICATION

This application is related to copending application Ser. No. 483,501, now U.S. Pat. No. 5,024,871, "Ceramic Filled Fluoropolymeric Composite Material" by D. J. Arthur and G. Swei, filed on the same date herewith.

SUMMARY OF THE INVENTION

Commonly assigned U.S. Pat. No. 4,849,284 ('284 patent), the disclosure of which is incorporated herein by reference, describes a ceramic filled fluoropolymer matrix electrical substrate material sold by Rogers Corporation under the trademark RO-2800. This material preferably comprises a polytetrafluoroethylene matrix filled with amorphous fused silica and microfiberglass. The silica filler is coated with a silane coating material which renders the surface of the silica hydrophobic and provides improved tensile strength, peel strength and dimensional stability to the composite material. The electrical substrate material is well suited for forming a rigid printed wiring board substrate and exhibits improved electrical performance over other printed wiring board substrate materials.

Two properties are of particular interest with regard to the performance of an electrical printed wiring board substrate material. A low dielectric constant, i.e. (DK) DK≦about 3 is particularly desirable in such materials. The low significantly improves the electrical performance of PWB material by a reduction in propagation delay, cross-talk, and rise time degradation in digital and microwave PWB applications. It is also important that PWB substrate materials exhibit a low Z axis coefficient of thermal expansion, i.e. (CTE) CTE≦about 70 ppm/°C. The substrate of the 284 patent comprises a fluoropolymer matrix and a silane-coated ceramic filler. The substrate exhibits a DK of about 2.8 and a Z-axis CTE of about 24 ppm/°C.

There is a constant and intensive effort in the art to develop PWB substrate materials which exhibit an advantageous balance of mechanical, thermal and electrical properties.

DISCLOSURE OF THE INVENTION

A composite material is disclosed. The composite material, comprises a fluoropolymer matrix, from about 20 volume % to about 70 volume % first coated inorganic particles distributed throughout the matrix. The first coated inorganic particles comprise hollow inorganic microspheres and a hydrophobic coating on the microspheres. The material exhibits a DK of less than about 2.5 and a Z-axis CTE of less than about 50 ppm/°C.

DETAILED DESCRIPTION OF THE INVENTION

Figure 1:
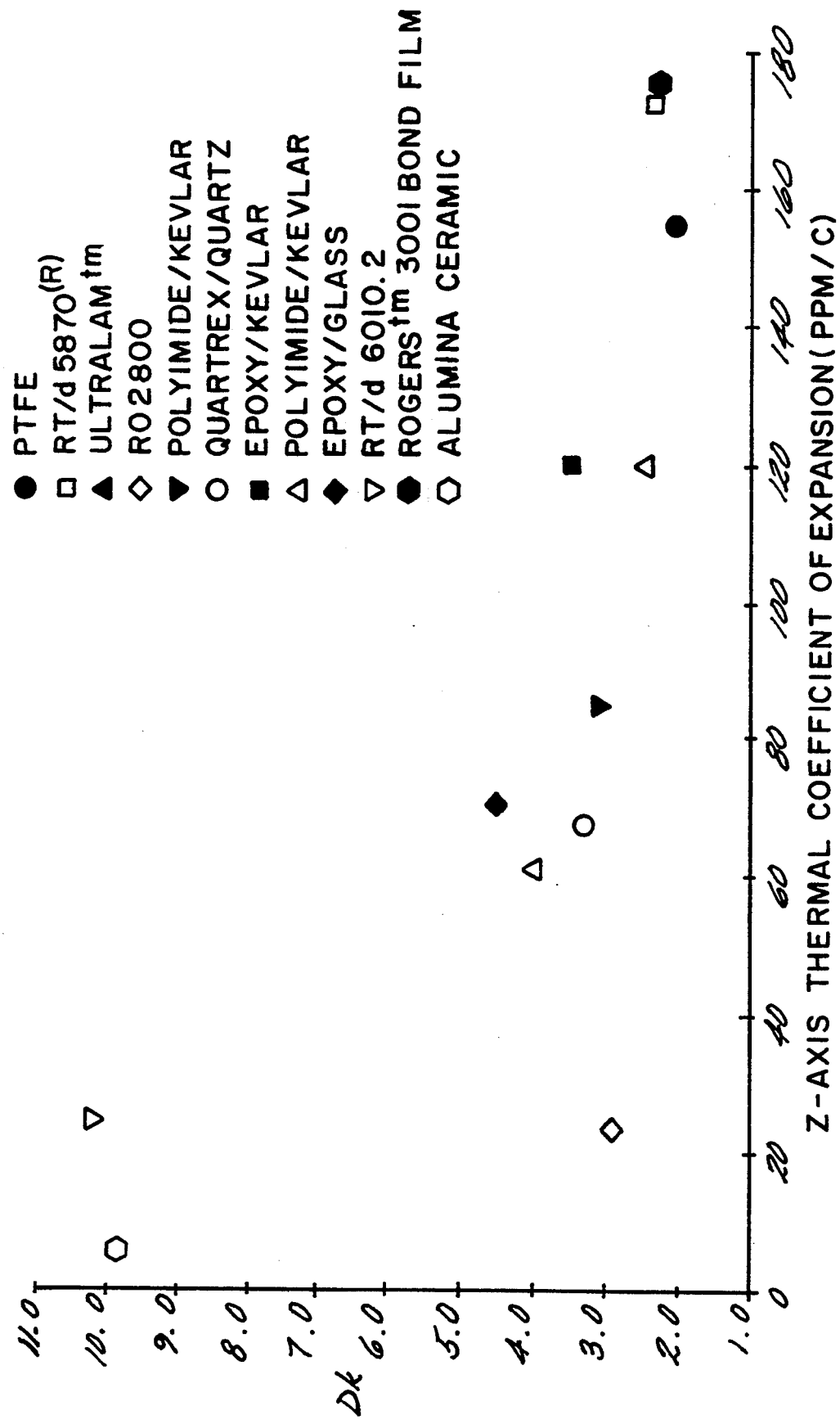
FIGURE 1 shows a comparison of dielectric constant and the Z axis CTE for a number of dielectric substrate materials.

The fluoropolymer matrix of the composite material of the present invention may comprise any fluoropolymer that exhibits a low dielectric constant. Polytetrafluoroethylene (PTFE), hexafluoropropene (HFP), tetrafluoropolyethylene (TFE), and perfluoroalkylvinyl ether (PAVE), are examples of suitable fluoropolymer matrix materials. It will be appreciated that PTFE, HFP, TFE and PAVE are all thermoplastic fluoropolymers. PTFE is the preferred matrix material.

A PTFE powder known as Teflon ® 6C, available from DuPont, and a PTFE dispersion known as Fluon ® AD704, available from ICI, have been found to be particularly well suited for use in the present invention.

The first inorganic particles of the present invention may comprise hollow inorganic microspheres and a hydrophobic coating on the microspheres. It is preferred that the first inorganic particles exhibit low ionic contamination.

Hollow inorganic microspheres having a density of less than about 1 gram/cubic centimeter (g/cm$^3$) are preferred. For a given microsphere material, the theoretical dielectric constant of the microsphere decreases with decreasing density. It should be noted that since the microspheres become increasingly fragile and susceptible to mechanical damage during processing with decreasing microsphere density, a balance between performance and processability must be determined, based on the particular application of the material of the present invention.

Hollow inorganic microspheres are available from a number of commercial sources. Hollow glass microspheres and hollow ceramic microspheres are suitable for use in the present invention. Silica microspheres and borosilicate microspheres are preferred. Hollow silica microspheres, known as SI Eccospheres and manufactured by Emerson & Cuming, Dewey & Almy Chemical Division of W. R. Grace & Co. of Canton, Mass., hollow borosilicate microspheres, known as H-50/10,000 Glass Bubbles, manufactured by 3M Company of St. Paul, Minn. and, hollow high silica microspheres known as SDT-60 Eccospheres, also manufactured by Emerson and Cuming, have been found to be particularly suitable for use in the practice of the present invention. The SI Eccospheres are hollow silica microspheres having an average particle size of about 80 μm and an average particle density ranging from about 0.14g/cm$^3$ to about 0.8g/cm$^3$. The H-50/10,000 are hollow borosilicate microspheres having an average particle density of about 0.5g/cm$^3$ to about 0.6g/cm$^3$ and are available in different particle size distributions. The SDT-60 Eccospheres are hollow high silica microspheres having an average particle density of about 0.28g/cm$^3$ and particles ranging in size from about 5 μm to about 40 μm.

The first inorganic particles comprise between about 10 volume % and about 70 volume % of the composite material of the present invention. Preferably the first inorganic particles comprise between about 15 volume % and about 65 volume % of the composite material of the present invention. In applications which low DK is of primary importance, it is preferred that the composition of the present invention comprises from about 35 volume percent to about 65 volume percent hollow inorganic microspheres.

The second inorganic particles of the present invention may comprise any particulate inorganic filler material that exhibits a low coefficient thermal expansion and low DK. It is preferred that the second inorganic particles exhibit low ionic contamination. The second inorganic particles may comprise porous second inorganic particles or nonporous second inorganic particles.

The porous inorganic particles of the present invention may be any porous inorganic particles having a dielectric constant of less than 3.5. It is preferred that the porous inorganic particles have void space greater than about 20 volume % and internal surface of the voids being area greater than about 150 m²/g. It is preferred that the porous inorganic particles comprise porous silica particles. The preferred range of particle size of the porous inorganic particles is dependent upon the particular application of the composite material. Glass particles, known as Corning VYCOR ® 7930, manufactured by Corning Glass Works, Corning, N.Y. have been found to be particularly well suited for use as the porous second inorganic particles of the present invention. VYCOR ® 7930 glass particles have a dielectric constant of about 3.0, a void space of about 28 volume %, a surface area of about 250 m²/g, an average pore diameter of about 40 Angstroms and a specific gravity of about 1.5.

Suitable nonporous second inorganic particles include glass particles, ceramic particles, glass fibers and ceramic fibers. While continuous fibers may be suitable for use in some embodiments of the present invention, discontinuous fibers are preferred.

Silica particles are particularly preferred nonporous second inorganic particles and amorphous fused silica particles are most preferred nonporous second inorganic particles. It is preferred that the nonporous second inorganic particles of the present invention exhibit an average particle size less than about 30 microns. Amorphous fused silica particles known as GP-7I, manufactured by Harbison-Walker were found to be particularly well suited for use as nonporous second inorganic particles of the present: invention.

The second inorganic particles comprise up to about 55 volume % of the composite material of the present invention. The second inorganic particles preferably comprise less than about 40 vol. % of the composite material of the present invention for application in which low DK is of primary importance.

The hydrophobic coating of the present invention may comprise any coating material that is thermally stable, exhibits a low surface energy, and improves the moisture resistance of the composite of the present invention. Suitable coating materials include conventional silane coatings, titanate coatings and zirconate coatings. Preferred silane coatings include: phenyltrimethoxysilane, phenyltriethoxysilane, 3,3,3-trifluropropyl) trimethoxysilane, (tridecafluoro-1,1,2,2-tetrahydrodecyl)-1,1 triethoxysilane (heptadecafluoro-1,1,2,2-tetrahydrodecyl) 1-triethoxysilane and mixtures thereof. Suitable titanate coatings include: neopentyl(-diallyl)oxytrineodecanoyl titanate, neopentyl(diallyl-)oxytri(dodecyl)benzene-sulfonyl titanate and neopentyl(diallyl)oxytri(dioctyl)phosphate titanate. Suitable zirconate coatings include: neopentyl(diallyl)oxytri (dioctyl)pyrophosphate zirconate and neopentyl(diallyl-)oxytri(N-ethylenediamino)ethyl zirconate.

The hydrophobic coating is used in an amount effective to render the surfaces of the filler particles hydrophobic and compatible with the matrix material. The amount of coating relative to the amount of inorganic particles coated will vary with the surface area coated and density of the inorganic particles. Preferably, the coated inorganic particles of the present invention include from about 3 parts by weight (pbw) hydrophobic coating: 100 pbw inorganic particles to about 15 pbw hydrophobic coating: 100 pbw inorganic particles.

The filler materials are coated by agitating the filler materials in a solution of the coating material, removing the filler material from the solution and finally heating the filler material to evaporate solvents from the coating and to react the coating with the surface of the filler material.

The composite material of the present invention is compounded by the procedure outlined in U.S. Pat. No. 4,335,180 the disclosure of which is incorporated by reference. Briefly, the process includes mixing silane coated inorganic particle with a fluoropolymer dispersion, coagulating the mixture using a flocculating agent, filtering the coagulated the mixture and then consolidating mixture to form a composite substrate at elevated temperature (600° F. to 800° F.) and pressure (100 psi to 900 psi) Alternatively, a fluoropolymer powder may be mixed with the coated filler particles and the mixture so formed may be consolidated under elevated temperature and pressure to form the composite substrate. It should be noted that consolidation pressures must be limited to pressures below the compressive strength of the microspheres to avoid excessive breakage of the microspheres.

EXAMPLE

Samples of the composite material of the present invention were prepared.

A hydrolyzed silane coating solution was made by dissolving 3 wt % of (tridecafluoro-1,1,2,2 tetrahydrooctyl)1 triethoxysilane in isopropanol. The solution was diluted with water to produce a solution having a water to silane stoichiometric ratio of 3 to 1. The pH of the solution was adjusted to 5 with acetic acid. The solution was then stirred for 24 hours.

The inorganic particles were coated with the silane coating solution. The particles were immersed in the solution and agitated in a Patterson-Kelly mixer for 40 minutes. The mixture was stored for 8 hours in a closed container The particles were removed from the solution and dried at 120° C. to evaporate the solvents from the mixture and to cure the silane coating onto the surfaces of the particles.

The particles were combined with a fluoropolymer matrix to make sample composite materials. The coated filler particles were mixed with fluoropolymer particles (Teflon ® 6C) and a lubricant (dipropylene glycol) to form a paste. The paste was extruded and calendered at room temperature to form sheets. The sheets were lot pressed at 700° F. and 500 pounds per square inch (psi) to consolidate the composite material.

The above procedure was repeated to produce samples of different compositions. The composition of each of the samples by volume fraction is given in Table 1.

TABLE 1

| | A | B | C | D | E | F | G | H |
|---|---|---|---|---|---|---|---|---|
| FLUOROPOLYMER MATRIX | | | | | | | | |
| PTFE | 40 | 40 | 40 | 40 | 40 | 40 | 40 | 40 |
| FIRST INORGANIC | | | | | | | | |

TABLE 1-continued

| | A | B | C | D | E | F | G | H |
|---|---|---|---|---|---|---|---|---|
| PARTICLES | | | | | | | | |
| silica microspheres[2] | 60 | — | — | — | — | 50 | — | — |
| borosilicate microspheres[3] | — | 60 | — | — | — | — | 30 | — |
| borosilicate microspheres[4] | — | — | 60 | — | — | — | — | 40 |
| silica microspheres[5] | — | — | — | 30 | 30 | — | — | — |
| SECOND INORGANIC PARTICLES | | | | | | | | |
| porous silica particles[6] | — | — | — | — | — | — | — | 20 |
| amorphous fused silica[7] | — | — | — | 30 | 30 | 10 | 30 | — |
| HYDROPHOBIC COATING | | | | | | | | |
| silane coupling agent[8] | + | + | + | + | −/+[9] | + | + | + |

[1] Teflon 6C, DuPont
[2] SDT-60, Emerson & Cuming
[3] H-50/10,000 (325 Mesh), 3M
[4] H-50/10,000 (500 mesh), 3M
[5] SI Eccospheres, Emerson Cuming
[6] Vycor 7930, Corning Glass Works
[7] GP-71, Harbison-Walker
[8] Tridecafluoro-1,1,2,2-tetrahydrooctyl-,1-triethoxysilane
[9] Coupling agent on second particles only The DK and CTE and water absorption of the composite materials so produced were measured and are set out in Table 2 below.

TABLE 2

| | A | B | C | D | E |
|---|---|---|---|---|---|
| Dielectric Constant | 1.938 | 1.943 | 2.029 | 2.42 | 2.38 |
| CTE (ppm/°C.) | 47 | 50 | 41 | 29 | 29 |
| Water Absorption | 2.84[1] | 1.72[2] | 1.91[1] | 0.56[1] | 0.68[1] |

| | F | G | H |
|---|---|---|---|
| Dielectric Constant (@ 10 GHz) | 2.109 | 2.31 | 2.20 |
| CTE (ppm/°C.) | 33 | 20 | 32 |
| Water absorption | — | 2.85[1] | 1.80[1] |

[1] = 48 hours, 50° C.
[2] = 24 hours, 50° C.

Comparison of samples A, B, and C shows the effect of difference choices of first organic particles. Comparison of samples A, F, G, and H show the effect of introducing second inorganic particles. Comparison of the water absorption results of samples D and E demonstrates the benefit of using the coupling agent of the present invention.

The DK and Z axis CTE for a number of conventional dielectric substrate materials are presented in FIG. 1 for comparison with the values tabulated in Table 2. None of the conventional substrate materials exhibit a DK of less than about 2.5 and a z-axis CTE of less than about 50.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A composite material, comprising:
a polytetrafluoroethylene fluoropolymer matrix;
from about 20 volume percent to about 70 volume percent first coated inorganic particles distributed throughout the matrix in a paste extrusion or calendering process, said first coated inorganic particles comprising hollow inorganic microspheres; and
a hydrophobic coating on the microspheres;
wherein the composite material exhibits a dielectric constant of less than about 2.5 and a thermal coefficient of expansion of less than about 70 ppm/°C.

2. The composite material of claim 1, wherein the hollow inorganic microspheres comprise glass microspheres or ceramic microspheres.

3. The composite material of claim 2, wherein the glass microspheres comprise silica glass or borosilicate glass.

4. The composite material of claim 1, wherein the hydropobic coating is selected from the group consisting of silane coatings, zirconate coatings and titanate coatings.

5. The composite material of claim 4, wherein the first coated inorganic particles comprises between about 3 to about 15 parts by weight coating per 100 parts by weight microspheres.

6. The composite material of claim 4, wherein the coating comprises phenyltrimethoxysilane, phenyltriethoxysilane, (3,3,3-trifluoropropyl) trimethoxysilane, (tridecafluoro-1,1,2,2 tetrahydrooctyl) 1,1 triethoxysilane, (heptadecafluoro-1,1,2,2-tetrahydrodecyl)-1-triethoxysilane and mixtures thereof.

7. The composite material of claim 4, wherein the coating comprises neopentyl(diallyl)oxytrineodecanoyl titanate, neopentyl(diallyl)oxytri(dodecyl)benzene-sulfonyl titanate or neopentyl(diallyl)oxytri(dioctyl)phosphate titanate.

8. The composite material of claim 4, wherein the coating comprises neopentyl(diallyl)oxytri(dioctyl)-pyrophosphate zirconate or neopentyl(diallyl)oxytri(N-ethylenediamino)ethyl zirconate.

9. The composite material of claim 1, further comprising:
up to about 35 volume percent of second coated inorganic particles distributed throughout the matrix, provided that the combined amount of the first and second coated inorganic particles does not exceed 70 volume percent, said second coated inorganic particles comprising inorganic particles selected from the group consisting of porous inorganic particles having a void space greater than about 20 volume % and an internal surface area of the voids being greater than about 150 m²/g, solid inorganic particles and mixtures thereof.

10. The composite material of claim 9, wherein the second coated inorganic particles comprise porous inorganic particles having a void space greater than about 20 vol % and an internal surface area of the voids being greater than about 150 m²/g.

11. The composite material of claim 10, wherein the porous inorganic particles comprises porous glass particles or porous ceramic particles.

12. The composite material of claim 11, wherein the porous glass particles comprise a silica glass.

13. The composite material of claim 9, wherein the second inorganic particles comprise solid inorganic particles.

14. The composite material of claim 13, wherein said solid inorganic particles are amorphous fused silica particles.

15. An electrical substrate material comprising:

a polytetrafluoroethylene fluoropolymer matrix;
from about 20 volume percent to about 70 volume percent first coated inorganic particles distributed throughout the matrix in a paste extrusion or calendering process, said first coated inorganic particles comprising hollow inorganic microspheres; and
a hydrophobic coating on the microspheres;
wherein the electrical substrate material exhibits a dielectric constant of less than about 2.5 and a thermal coefficient of expansion of less than about 70 ppm/°C.

16. The electric substrate material of claim 15 wherein the hollow inorganic microspheres comprise glass microspheres or ceramic microspheres.

17. The electrical substrate material of claim 16 wherein the glass microspheres comprise silica glass or borosilicate glass.

18. The electrical substrate material of claim 15 wherein the hydrophobic coating is selected from the group consisting of silane coatings, zirconate coatings and titanate coatings.

19. The electrical substrate material of claim 18 wherein the first coated inorganic particles comprises between about 3 to about 15 parts by weight coating per 100 parts by weight.

20. The electrical substrate material of claim 18 wherein the coating comprises phenyltrimethoxysilane, phenyltriethoxysilane, (3,3,3-trifluoropropyl) trimethoxysilane, (tridecafluoro-1,1,2,2 tetrahydrooctyl) 1,1 triethoxysilane, (heptadecafluoro-1,1,2,2-tetrahydrodecyl)-1-triethoxysilane or mixtures thereof.

21. The electrical substrate material of claim 18 wherein the coating comprises neopentyl(diallyl)oxytrineodecanoyl titanate, neopentyl(dially)oxytri(-dodecyl)benzene-sulfonyl titanate or neopentyl(diallyl)oxytri(dioctyl)phosphate titanate.

22. The electrical substrate material of claim 18 wherein the coating comprises neopentyl(diallyl)oxytri(dioctyl)-pyrophosphate zirconate or neopentyl(diallyl)oxytri(N-ethylenediamino)ethyl zirconate.

23. The electrical substrate material of claim 15 further comprising:
up to about 35 volume percent of second coated inorganic particles distributed throughout the matrix, provided that the combined amount of the first and second coated inorganic particles does not exceed 70 volume percent, said second coated inorganic particles comprising inorganic particles selected from the group consisting of porous inorganic particles having a void space greater than about 20 volume % and an internal surface area of the voids being greater than about 150 m²/g, solid inorganic particles and mixtures thereof.

24. The electrical substrate material of claim 23 wherein the second coated inorganic particles comprise porous inorganic particles having a void space greater than about 20 volume % and an internal surface area of the voids being greater than about 150 m²/g.

25. The electrical substrate material of claim 24 wherein said porous inorganic particles comprises porous glass particles or porous ceramic particles.

26. The electrical substrate material of claim 25 wherein the porous glass particles comprise a silica glass.

27. The electrical substrate material of claim 23 wherein the second inorganic particles comprise solid inorganic particles.

28. The electrical substrate material of claim 27 wherein said solid inorganic particles are amorphous fused silica particles.

29. A composite material, consisting essentially of:
a polytetrafluoroethylene fluoropolymer matrix;
from about 20 volume percent to about 70 volume percent first coated inorganic particles distributed throughout the matrix in a paste extrusion or calendering process, said first coated inorganic particles comprising hollow inorganic microspheres; and
a hydrophobic coating on the microspheres;
wherein the composite material exhibits a dielectric constant of less than about 2.5 and a thermal coefficient of expansion of less than about 70 ppm/°C.

30. An electrical substrate material consisting essentially of:
a polytetrafluoroethylene fluoropolymer matrix;
from about 20 volume percent to about 70 volume percent first coated inorganic particles distributed throughout the matrix in a paste extrusion or calendering process, said first coated inorganic particles comprising hollow inorganic microspheres; and
a hydrophobic coating on the microspheres;
wherein the electrical substrate material exhibits a dielectric constant of less than about 2.5 and a thermal coefficient of expansion of less than about 70 ppm/°C.

31. The material of claim 1 wherein:
said paste extrusion process parameters corresponding to a pressure of about 12,000 psi through a 4.8 mm diameter die.

32. The material of claim 15 wherein:
said paste extrusion process includes process parameters corresponding to a pressure of about 12,000 psi through a 4.8 mm diameter die.

33. The material of claim 29 wherein:
said paste extrusion process includes process parameters corresponding to a pressure of about 12,000 psi through a 4.8 mm diameter die.

34. The material of claim 30 wherein:
said paste extrusion process includes process parameters corresponding to a pressure of about 12,000 psi through a 4.8 mm diameter die.

* * * * *

UNITED STATES PATENT AND TRADEMARK OFFICE
CERTIFICATE OF CORRECTION

PATENT NO. : 5,354,611
DATED : October 11, 1994
INVENTOR(S) : David J. Arthur, et al It is certified that error appears in the above-identified patent and that said Letters Patent is hereby corrected as shown below:

Column 1, line 17, delete "SUMMARY" and insert therefor --BACKGROUND--.
Column 1, line 38, insert --DK-- between "low" and "significantly".
Column 3, line 58, insert -- -- -- between ")" and "1-triethoxysilane".
Column 4, line 20, delete "the" between "coagulated" and "mixture".
Column 4, line 46, insert period --.-- between "container" and "The".
Column 4, line 55, delete "lot" and insert therefor --hot--.
Column 5, line 35, delete "$1.72_2$" and insert therefor -- $1.73_2$ -- both under Table 2, column B.
Column 6, line 29, delete "and" and insert therefor --or--.

Signed and Sealed this

Sixth Day of June, 2000

Attest:

Q. TODD DICKINSON

*Attesting Officer*   *Director of Patents and Trademarks*